(12) United States Patent
Kuan et al.

(10) Patent No.: US 6,433,354 B1
(45) Date of Patent: Aug. 13, 2002

(54) SUPERLATTICE INFRARED PHOTODETECTOR HAVING FRONT AND REAR BLOCKING LAYERS TO ENHANCE BACKGROUND LIMITED PERFORMANCE

(75) Inventors: Chieh-Hsiung Kuan, Taipei; Jen-Ming Chen, Taichung; Chun-Chi Chen, Tainan; Mao-Chieh Hsu, Taipei, all of (TW)

(73) Assignees: National Taiwan University; Integrated Crystal Technology Incorporation, both of (TW)

( * ) Notice: Subject to any disclaimer, the term of this patent is extended or adjusted under 35 U.S.C. 154(b) by 0 days.

(21) Appl. No.: 09/764,268

(22) Filed: Jan. 19, 2001

(30) Foreign Application Priority Data

Nov. 2, 2000 (TW) ........................................ 89123060 A (51) Int. Cl.[7] .............................................. H01L 29/06
(52) U.S. Cl. .............................. 257/14; 257/15; 257/21
(58) Field of Search ........................ 257/21, 15; 357/4, 357/16, 30

(56) References Cited

U.S. PATENT DOCUMENTS 5,063,419 A * 11/1991 Glasser et al. ................ 357/16
5,128,728 A * 7/1992 Liu ................................. 357/4
5,352,904 A * 10/1994 Wen et al. ..................... 257/21
5,563,423 A * 10/1996 Wu et al. ...................... 257/21

* cited by examiner

Primary Examiner—Hoai V. Ho
Assistant Examiner—Thinh Nguyen
(74) Attorney, Agent, or Firm—Troxell Law Office PLLC (57) ABSTRACT

A superlattice infrared photodetector is disclosed, which can be fabricated easily by molecular beam epitaxy, has low power consumption and small dark current. Furthermore, the working temperature to operate the detector under background limited performance can be achieved by cooling down to the liquid nitrogen temperature. That is, the front and rear sides of the superlattice structure are added with blocking layers with sufficient height and width. The thickness is about 50 nm and the height of the energy barrier must be higher than the bottom of the second miniband of the superlattice structure by a value of more than 10 meV. Thereby, with the generation of photocurrent, the dark current is reduced at the same time. Therefore, the ratio of the photocurrent to the dark current can be improved effectively so that the working temperature for the background limited performance is increased vastly to even higher than 77 K.

7 Claims, 7 Drawing Sheets

SUPERLATTICE INFRARED PHOTODETECTOR HAVING FRONT AND REAR BLOCKING LAYERS TO ENHANCE BACKGROUND LIMITED PERFORMANCE

BACKGROUND OF THE INVENTION

1. Field of the Invention

The present invention relates to a superlattice infrared photodetector, which can be fabricated easily with molecular beam epitaxy, has the features of low power consumption, and small dark current. Furthermore, the working temperature to operate the detector under the background limited performance can be achieved by cooling down to the liquid nitrogen temperature. Moreover, the ratio of the photocurrent to the dark current can be improved effectively so that the working temperature for background limited performance increases greatly to even higher than 77 K.

2. Description of Related Art

The conventional quantum well infrared detector (QWIP) is designed for far infrared radiation detection (6–14 mm) which can be used at night vision, medical diagnosis or national defense missile systems, etc. The word "quantum" indicates the wave characteristics of the electrons. If the motion of the electrons is confined in space, the energy of the electrons will be quantized, and the resulting difference between the quantized energy levels falls in the infrared spectral region.

Figure 1A:
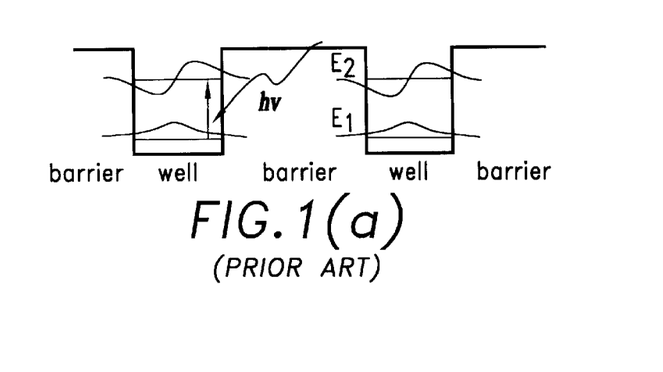
FIG. 1(a) is a schematic view showing the working principle of a quantum well infrared detector.

EP 275-150-A discloses a detector with an energy band structure illustrated in FIG. 1(a), which uses an energy band structure established by different material. In general, the quantum well and barrier regions are made of GaAs and AlGaAs respectively. In the quantum well, the electron is confined in space and two bound states are formed there. The electron in the lower energy level can transit to a higher energy level by the absorption of infrared radiation. The photo-excited electron has equal possibilities to move rightwards or leftwards so as to tunnel to an adjacent quantum well. To cause these electrons to move in the same direction, an external electric field must be added so that the electrons have a larger tunneling probability in the direction reverse to the electric field. The photocurrent due to tunneling effect of the photo-excited electrons will be detected for the electric field larger than a critical value for sufficient photo-excited electrons to be detected and therefore, the applied bias voltage is large.

Figure 1B:
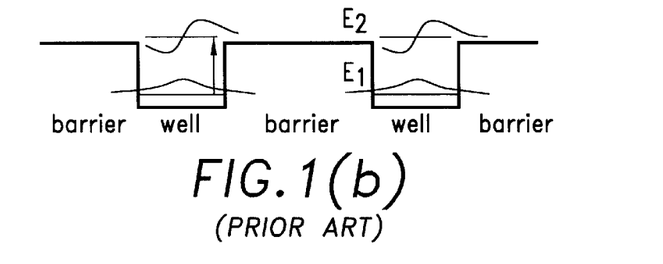
FIG. 1(b) shows a continuum-type detector having an energy barrier height lower than the second energy level.

In order to increase photocurrent, and avoid the aforesaid critical voltage, B. F. Levine et. al, in the paper with a title of "High Detectivity $D^*=10^{10}$ cm/$\sqrt{Hz}$W GaAs/AlGaAs Multiquantum Well $\lambda=8.3$ Å Infrared Detector" in App. Phys. Left. 53(4), Jul. 25, 1988, reduced the energy barrier so that the second energy level becomes a continuous one, as illustrated in FIG. 1(b) and thus, photoelectrons can be easily accelerated by electric field to arrive at a contact. In contrary, this will cause the dark current to increase dramatically. To reduce dark current, the barrier width is increased to a value of 50 nm, while the result is not preferred. The reasons are involved as follows. The dark current is induced from the physical mechanism of thermionic emission (in small bias), or thermally assisted tunneling (in large bias), and is primary determined by the difference between the Fermi level of the electron doping concentration in the quantum well and the energy height of the barrier. Both of the two physical mechanisms depend slightly on the width of the barrier. In particular, the thermal assisted tunneling is much related with the magnitude of the electric field instead of the applied voltage.

For the two quantum well infrared detectors described above, due to the restriction of the critical voltage and the increment of the barrier width, the bias range is within several volts for a detector with approximate 30 to 50 periods. Therefore, the power consumption must be taken into account if the heating effect due to the power consumption must be limited. Besides, if the dark current is too large in the operation point, not only the problem of the power consumption becomes serious, but also it is possible to affect the read-out circuit because the capacitance of the read-out circuit may not be large enough to withstand a large dark current. On the other hand, the most simple and cost-saving way for cooling these detectors is to use liquid nitrogen. Namely, it is preferably that the working temperature is about 77 K. In this situation, the cooling time of liquid nitrogen can be elongated due to the low power consumption of our detector.

In order to avoid the redundant power consumption, in general, it is expected that the detector should work in the background limited performance (BLIP). Namely, the photocurrent due to the background photon illumination is larger than the dark current. Under the background limited performance, the quantum well infrared detector must be cooled to a temperature at least lower than 65 K. Therefore, it is not suitable to cool the detector simply by liquid nitrogen (77 K). The dark current must be further reduced to increase the working temperature for background limited performance. The U.S. Pat. No. 5,198,682 discloses a way in which the doping concentration in adjacent quantum wells or the aluminum component in the energy barrier (i.e. the energy height of the barrier) is changed gradually so as to reduce the dark current. This way is executable. However, because of the multiple thick energy barriers, a strong electric field is necessary for the photocurrent to pass through these energy barriers, and this results in considerable power consumption.

Figure 1C:
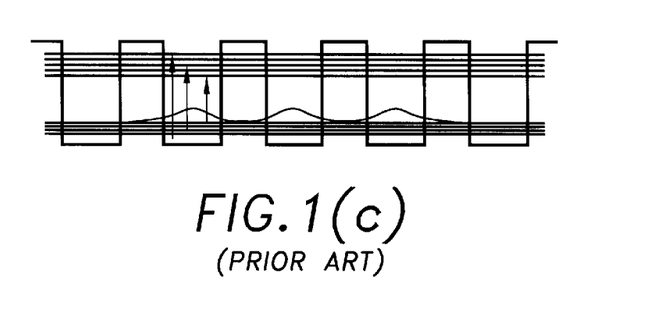
FIG. 1(c) is a schematic view showing the working principle of a superlattice structure.
Figure 1D:
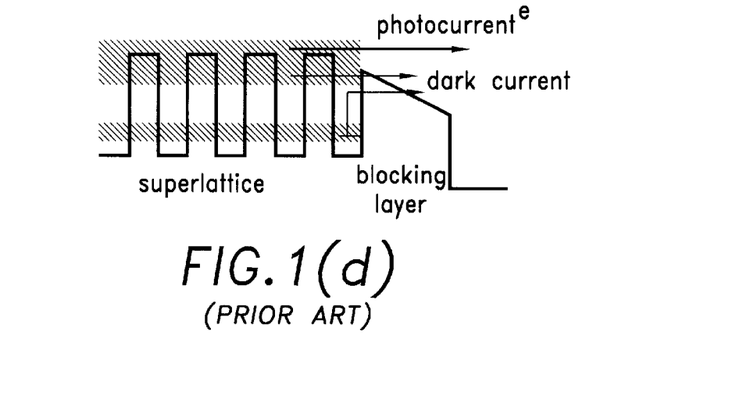
FIG. 1(d) is a schematic view showing the working principle of a superlattice infrared photodetector.

In order to reduce the inappropriate power consumption in a quantum well infrared detector, the inventor of the present invention discloses a superlattice infrared photodetector (SLIP) in the Electrochemical Society Proceedings Vol. 99-22 (page 485–495, 1999), wherein the superlattice structure is illustrated in FIG. 1(c) with a thinner energy barrier, about several nanometers. The single wavelength detection achieved by the transition between electron states in multiple quantum well is extended to a multiple-wavelength detection (indicated by the arrow in FIG. 1(c)) by the transition between minibands formed by the overlap of the electron wave functions in the adjacent potential wells. In addition, because of the thinner energy barrier, the electrons in the second energy band can freely move rightwards or leftwards nearly without external bias, and therefore, the power loss can be reduced significantly. Besides, to reduce the dark current induced by the electrons in the first miniband, and to collect the photoelectrons in the second miniband, a blocking layer with a width of about 50 nm is added to the rear side of the superlattice, as shown in FIG. 1(d). It should be noted that the height of the energy barrier of the blocking layer must be higher than the bottom of the second miniband. U.S. Pat. No. 5,077,593 discloses a similar idea, but the height of the energy barrier of the blocking layer is required to be lower than the bottom of the second miniband. Our design has the advantages of reducing dark current greatly and selectively choosing the required photoelectrons. Namely, the wavelengths to be detected are tunable. This is a great different to the prior art. However, if the detector is to work in the background limited performance, from experience of the inventor, it should be cooled below 60 K. It is because that the difference of the height of the energy barrier of the blocking layer with the Fermi level of the electron doping concentration in the superlattice is not sufficient large.

Another superlattice detector worth of mentioning is claimed by U.S. Pat. No. 5,352,294 as illustrated in FIG. 1(d). In that structure, an intermediate contact is added between the superlattice structure and the blocking layer so that the dark current flows out from this contact. However, for the photoelectrons to pass through the intermediate contact, the width of the intermediate contact must be thin enough, and the energy barrier height of the blocking layer must be small enough. Although this design can reduce the dark current, the manufacturing process becomes more complex. The dual contact structure is converted into a three contact one. Furthermore, the electrical connection to the middle contact is very difficult because of the small contact width.

SUMMARY OF THE INVENTION

Accordingly, the primary object of the present invention is to provide a superlattice infrared photodetector, which can be fabricated easily, has lower power consumption and smaller dark current. Furthermore, the working temperature to operate the detector under background limited performance can be achieved by cooling through liquid nitrogen. In addition, the superlattice structure are sandwiched between the front and rear blocking layers with sufficient height and width. The thickness is about 50 nm and the height of the energy barrier is 10 meV higher than the bottom of the second miniband of the superlattice structure. Thereby, as a photocurrent is generated, the dark current will reduce automatically. Therefore, the ratio of the photocurrent to the dark current can be improved effectively so that the working temperature for the background limited performance is increased greatly to even higher than 77 K.

The various objects and. advantages of the present invention will be more readily understood from the following detailed description when read in conjunction with the appended drawing.

BRIEF DESCRIPTION OF THE DRAWINGS

The foregoing and other features and advantages of the present invention will be more clearly understood from the following detailed description and the accompanying drawings, in which.

FIG. 4(a) shows the condition without light illumination;

FIG. 4(b) shows the condition with light illumination;

DETAILED DESCRIPTION OF THE PREFERRED EMBODIMENTS

Figure 2:
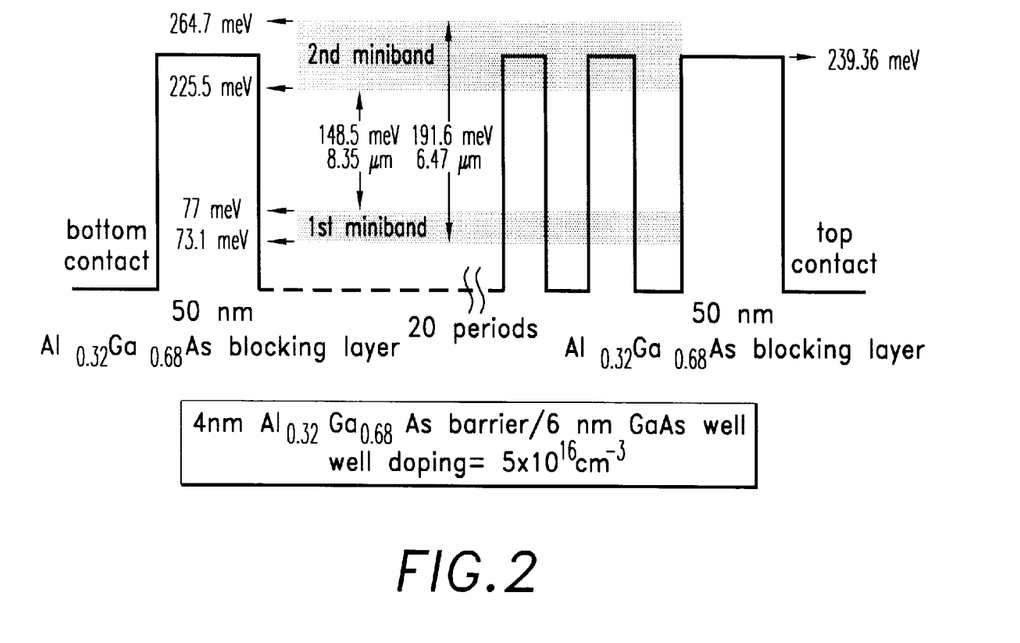
FIG. 2 shows the energy band of a novel superlattice infrared. photodetector.

An energy band diagram showing a complete structure of a superlattice infrared photodetector for suppressing dark current is illustrated in FIG. 2. The superlattice structure contains a 20-period 4 nm $Al_{0.32}Ga_{0.68}As$/6 nm GaAs wherein the doping concentration is $5 \times 10^6$ $cm^{-3}$. The associated band diagram of the detector is also illustrated in the drawing. In the present invention, blocking layers having a width of 50 nm are appended at both sides of the superlattice structure. The blocking layer has an aluminum fraction of 0.32 corresponding to energy barrier height of 239.36 meV and is 14 meV higher than the second miniband.

The front and rear blocking layers of the present invention has the following functions:

1) Similar to the thick energy barrier of a quantum well infrared photodetector, the blocking layer serves to block the dark current in the superlattice structure.

2) By changing the external bias, the voltage drop on the blocking layer can be controlled. Under low bias condition, only the electrons with higher transmission probability excited by the short wavelength infrared radiation may pass through the blocking layer and contribute to the photocurrent. When the bias is high, even the photo-excited electrons with original lower transmission probability at low biases may now pass through the blocking layer so that infrared radiation of long and short wavelength can be detected.

3) When no photocurrent occurs, the voltage drops on the front and rear blocking layers are similar so that the same amount of current passes through the front and rear blocking layers. When electrons are excited optically in the superlattice structure and then pass through the rear blocking layer by electric field, the total current passes through the rear blocking layer contains both photocurrent and dark current. Since the respective current amount flowing through the front and rear blocking layers must be equal, the voltage across the front blocking layer is elevated. On the contrary, due to the fixed applied bias, the voltage across the rear blocking layer is reduced. Therefore, the amount of the dark current is decreased, accordingly. The detailed description will be illustrated, hereinafter.

Figure 3:
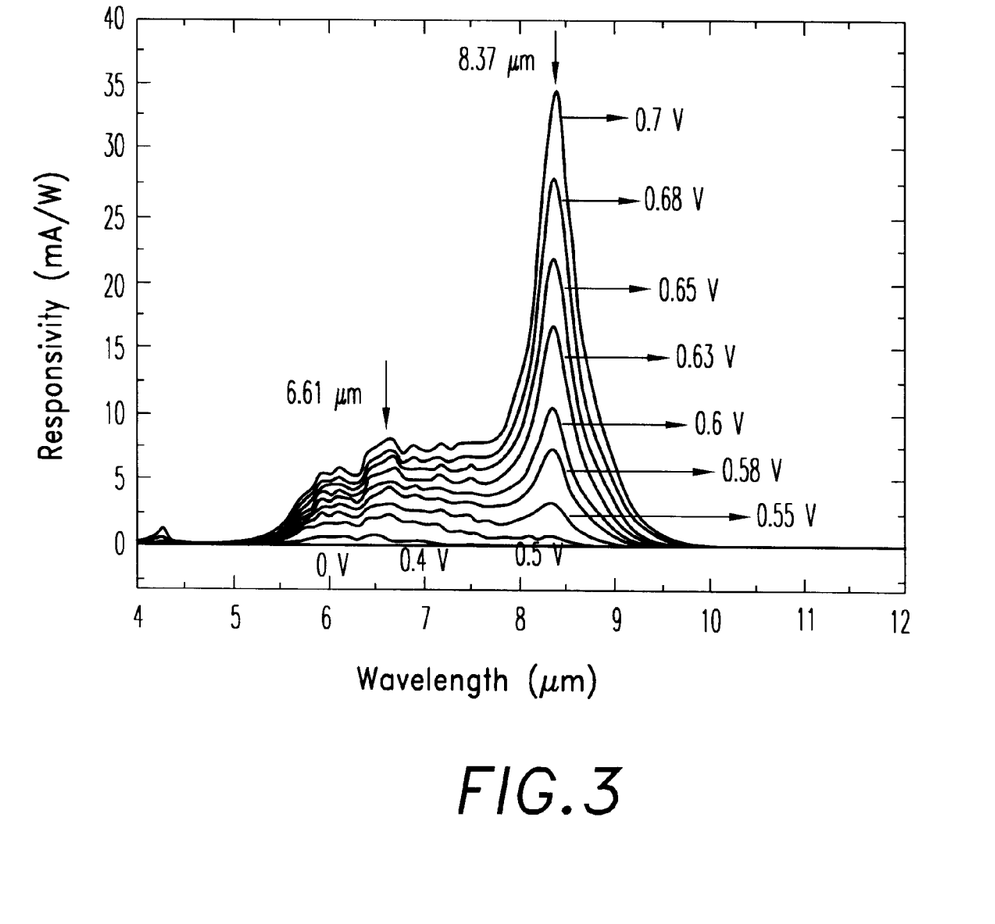
FIG. 3 shows the responsivity between a novel superlattice infrared photodetector and the wavelength of the absorbed infrared radiation, wherein the applied bias is also a parameter.

The details of item 2) is illustrated in FIG. 1(d). Since the energy barrier height of the blocking layer is higher than the bottom of the second miniband of the superlattice structure. At low bias, the photo-excited electrons with lower energy are blocked and thus can not pass through the blocking layer. When the external applied voltage is increased gradually, the width of the energy barrier of the blocking layer seen by the low energy photo-excited electron becomes small gradually. Thus, it is possible for them to pass through the blocking layer. This is the main theme in the selection of wavelength. FIG. 3 shows that as the bias voltage is changed gradually, the detector in FIG. 2 can detect various wavelength of light. The wavelengths of 6.61 μm and 8.37 μm are the respective wavelengths of two peaks of light absorption. The responsivity is the amount of the photocurrent per watt of infrared radiation. It is observed from FIG. 3 that the short wavelength (about 6.61 μm) dominates the spectral response in low bias region (0–0.5 V), while in high bias region (0.55–0.7 V), the long wavelength (8.37 μm) dominates the spectral response. Therefore, by external bias, the present invention can tune the detected wavelength so as to achieve the object of multiple wavelengths detection. In contrast to photodetectors utilizing quantum well structure, a series of different quantum: well with different spectral responses must be stacked to achieve multi-wavelength detection. Furthermore, the operating bias voltage of a quantum well infrared photodetector must attain a value of several volts, while the superlattice infrared photodetector can be operated with a bias voltage less than one volt so as to meet the requirement of low power consumption.

Figure 4A:
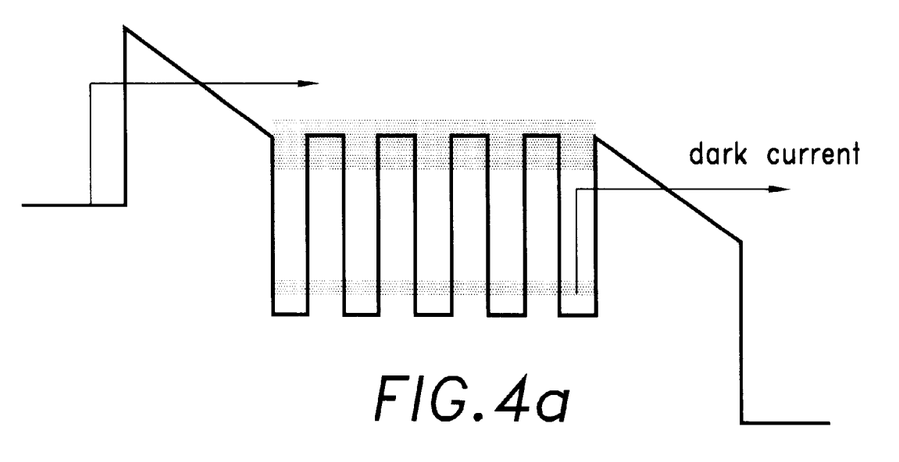
FIGS. 4(a) and 4(b) show the energy bands of a novel superlattice infrared photodetector with an applied bias.
Figure 4B:
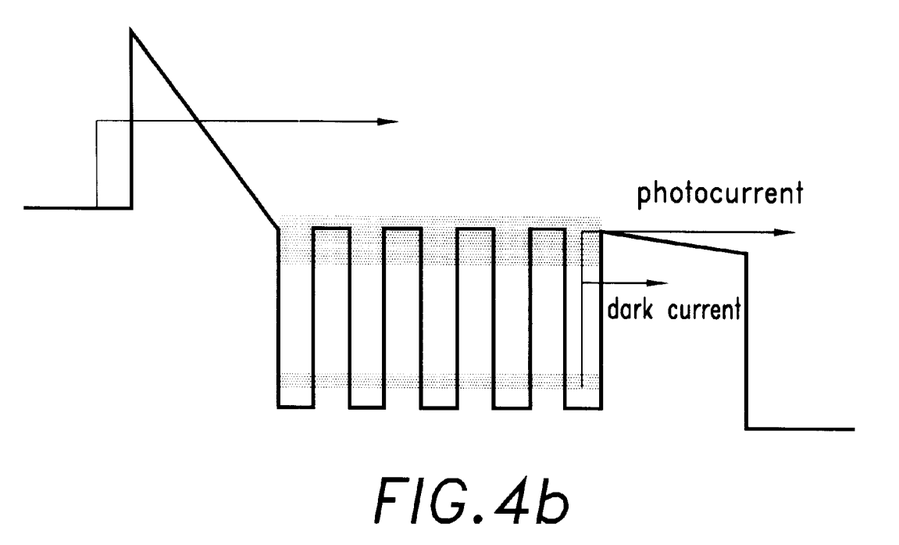

About above items 1) and 3), referring to FIG. 4(a) and FIG. 4(b), like the dark current in the quantum well, infrared photodetector, the dark current in the superlattice infrared photodetector of the present invention is primarily the thermally assisted tunneling current. That is, the electrons contributing to the dark current do not actually pass through the blocking layer with the energy of the first miniband but with their higher total energy by the assistance of phonon or impurity scattering. As illustrated in FIG. 4(a), without light illumination, the dark currents passing through the front and rear blocking layers must be identical, namely the principle of current continuity must be obeyed. Therefore, the voltage drops across the two blocking layers are approximately equal. Since the energy of a thermally assisted tunneling electron is smaller than the height of the energy barrier of the blocking layer, the blocking layer can completely block the dark current in a lower bias region. When the bias voltage is high, the thickness of the blocking layer seen by the electron becomes smaller, and the possibility of tunneling increases. As a result, the dark current increases with the bias voltage. Referring to FIG. 4(b), photocurrent will be generated when light is incident upon the detector. The possibility that the photocurrent flows rightwards and leaves the rear blocking layer is much larger than the possibility that the photocurrent flows leftwards and leaves the front blocking layer. Therefore, the net photocurrent flows rightwards through the rear blocking layer. As a result, the current passing through the blocking layer contains both photocurrent and dark current. To equalize the currents flowing through the front and rear blocking layers, the voltage drop across the front blocking layer is increased to provide more current so as to supply the needed amount of the current flowing through the rear blocking layer and containing both photocurrent and dark current. In addition, since the total voltage drop is fixed, the voltage drop across the rear blocking layer must be decreased. The applied biases in FIG. 4(a) and FIG. 4(b) are the same, but they have different voltage distribution because of the generation of photocurrent. Furthermore, it should be noted that the energy of photocurrent is larger than dark current (as the heights indicated by the arrow of the drawing). Therefore, the effect of the bias reduction of the rear blocking layer on the photocurrent is smaller than that on the dark current. Moreover, in the drawing the length of the arrow represents the amount of the current. The dark current is smaller because of the reduction of the voltage drop. Thus, the ratio of the photocurrent to the dark current can be increased. Alternatively, the working temperature under the background limited performance also increases. It is only when the height of the energy barrier of the blocking layer is sufficient, the temperature for the background limited performance can be increased to a value of 77 K.

Figure 5:
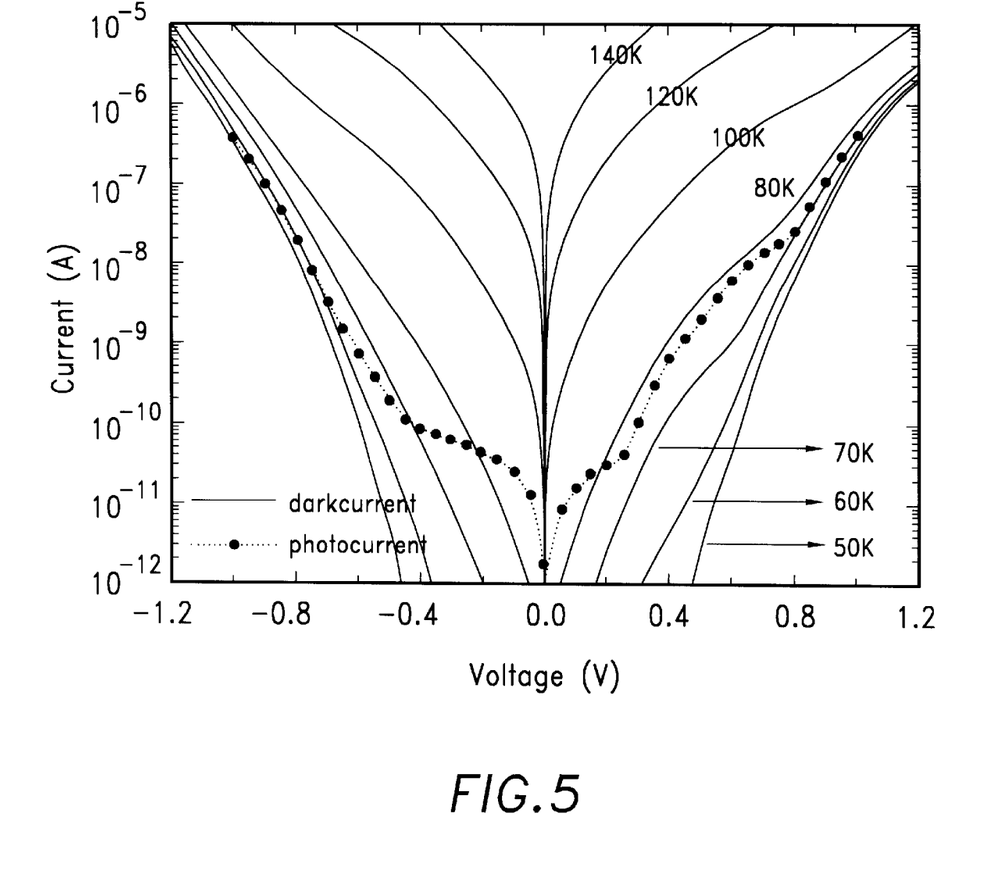
FIG. 5 shows the I–V curve of a novel superlattice infrared photodetector, in which the temperature for the background limited performance can attain to a value of 77 K.
Figure 6A:
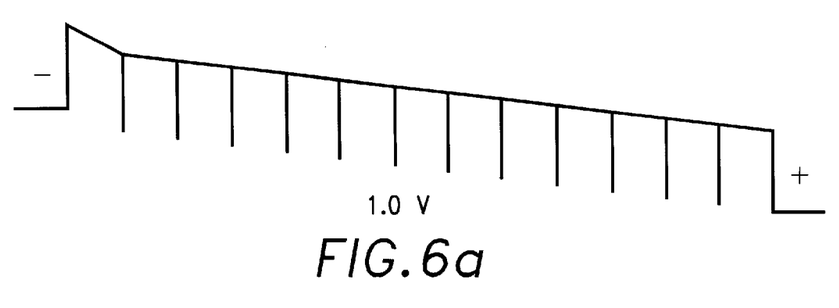
FIG. 6 shows the energy band of a quantum well infrared detector with an applied voltage.
Figure 6B:
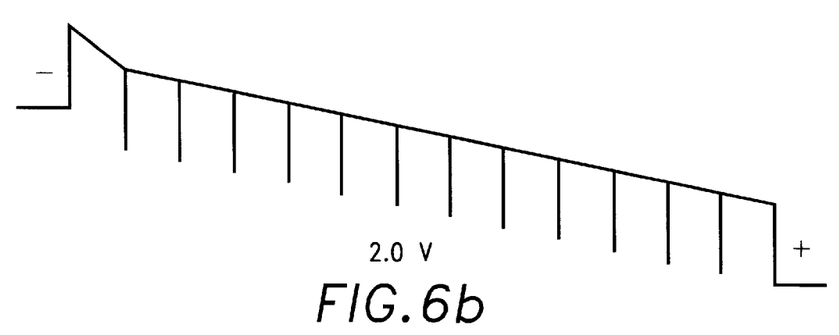
Figure 6C:
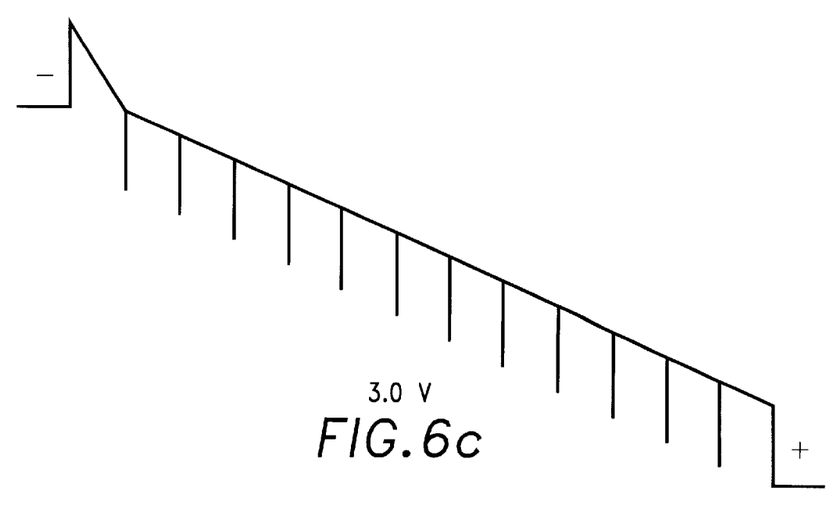

FIG. 5 shows the relation of the current to voltage in the embodiment of the present invention, in which the solid lines show the variation trend of the dark current in different temperature (50 K to 140 K). The dashed line formed by round points is photocurrent induced from the background photons with about 135 degrees of the view angle of the detector. Obviously, in a positive bias voltage, the working temperature for the background limited performance is below 77 K. Therefore, it confirms that the design of the present invention is successful. On other hands, the quantum well infrared photodetector can not achieve the aforesaid effect. It is because there are many energy barriers thereof. FIG. 6 shows a schematic view of the voltage distributions of the energy barriers in the quantum well infrared detector with external bias of 1 V, 2 V and 3 V and without light illumination. Obviously, except the first energy barrier that has a larger bias voltage, the other energy barriers share an almost identical amount of voltages. This means that the voltage is almost uniformly distributed in each energy barrier. Even illuminated by light, the voltage variation of each energy barrier is very small, since the total variation must be distributed uniformly to each energy barrier.

Figure 7:
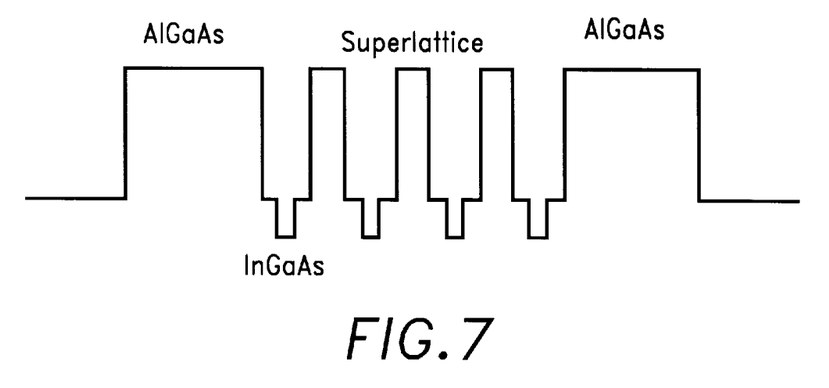
FIG. 7 shows a detector with a superlattice structure of InGaAs, GaAs/AlGaAs.
Figure 8:
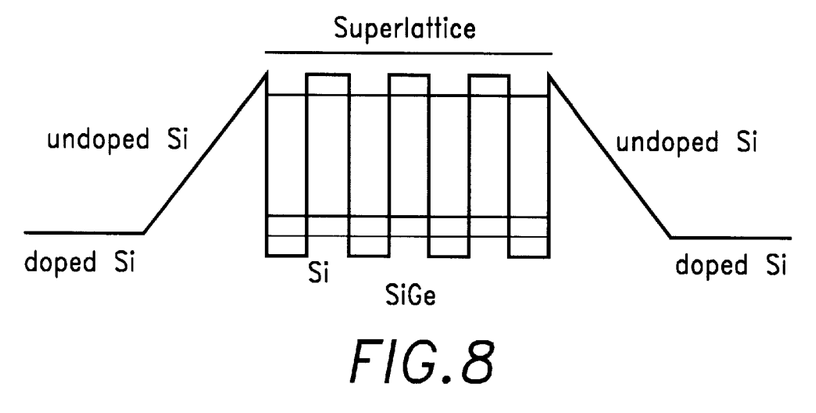
FIG. 8 shows a SiGe superlattice infrared photodetector.

In the present. invention, the superlattice infrared photodetector is not restricted to the GaAs/AlGaAs material, while it can be realized by other material system. Referring to FIG. 7, the superlattice structure is formed by GaAs, InGaAs (quantum well)/AlGaAs (energy barrier). The part of InGaAs (the recess portion in the drawing) must be smaller than the critical length. for coherent growth, and the other part are formed by GaAs. The doped material may be n type or p type. With reference to FIG. 8, the superlattice structure is made of SiGe (quantum well)/Si (energy barrier). The width of the quantum well (SiGe) with p-type dopant must be smaller than the critical length for coherent growth. The front and rear blocking layers are undoped Si. The width thereof must be larger enough to block the dark current.

In summary, the superlattice infrared photodetector of the present invention has the advantages of tunable detected wavelength and lower operating bias voltage than the prior art quantum well infrared detector. The blocking layer of the present invention can be used to block most of the dark current and most of the photocurrent is not affected so that the temperature for background limited performance is increased to a value of 77 K. Therefore, the liquid nitrogen can be used without the need to use other complex cooling systems for lower temperature, and the cost can be reduced greatly.

The present invention is thus described, it will be obvious that the same may be varied in many-ways. Such variations are not to be regarded as a departure from the spirit and scope of the present invention, and all such modifications as would be obvious to one skilled in the art are intended to be included within the scope of the following claims.

What is claimed is:

1. A superlattice infrared photodetector having enhanced background limited performance and comprising:
   a) a superlattice structure having a plurality of quantum wells interleaved with a plurality of AlGaAs energy barriers, a width of each quantum well being between 2 nm and 10 nm, and a width of each energy barrier being less than 10 nm so that a detected wavelength is between 5 μm and 20 μm, the superlattice structure having front and rear ends and forming first and second minibands each with predetermined uppermost and lowermost energy levels;
   b) a front AlGaAs blocking layer on the front end of the superlattice structure having a width of at least 50 nm forming an energy barrier of no less than the lowermost energy level of the second miniband; and, c) a rear AlGaAs blocking layer on the rear end of the superlattice structure having a width of at least 50 nm and forming an energy barrier of at least 10 meV over the lowermost energy level of the second miniband.

2. The superlattice infrared photodetector of claim 1 wherein the quantum wells are formed of n-type or p-type GaAs.

3. The superlattice infrared photodetector of claim 1 wherein each quantum well has a bottom with a recess therein, a width of the recess being less than the width of the quantum well and a critical length in a fully coherent growth of recess material.

4. The superlattice infrared photodetector of claim 3 wherein the recesses are formed in material made of InGaAs and bottoms of the quantum well are GaAs.

5. The superlattice infrared photodetector of claim 1 further comprising a variable voltage bias applied to the rear blocking layer of the photodetector whereby the wavelength of the detected infrared radiation is varied by varying the voltage bias.

6. A superlattice infrared photodetector having enhanced background limited performance and comprising:

a) a superlattice structure having a plurality of p-type SiGe quantum wells interleaved with a plurality of Si energy barriers, a width of each quantum well being between 2 nm and 10 nm and within a critical length of fully coherent growth, and a width of each energy barrier being less than 10 nm so that a detected wavelength is between 5 $\mu$m and 20 $\mu$m, the superlattice structure having front and rear ends and forming first and second minibands each with predetermined uppermost and lowermost energy levels; and, b) a front and rear undoped Si blocking layers on the front and rear ends of the superlattice structure having a width of at least 50 nm forming an energy barrier of at least 10 meV over the lowermost energy level of the second miniband.

7. The superlattice infrared photodetector of claim 6 further comprising a variable voltage bias applied to the rear blocking layer of the photodetector whereby the wavelength of the detected infrared radiation is varied by varying the voltage bias.

* * * * *